(12) United States Patent
Nikaido

(10) Patent No.: US 7,683,485 B2
(45) Date of Patent: Mar. 23, 2010

(54) SEMICONDUCTOR DEVICE

(75) Inventor: Hirofumi Nikaido, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 203 days.

(21) Appl. No.: 12/071,123

(22) Filed: Feb. 15, 2008

(65) Prior Publication Data

US 2008/0217774 A1   Sep. 11, 2008

(30) Foreign Application Priority Data

Mar. 7, 2007   (JP)  ............... 2007-057120

(51) Int. Cl.
  H01L 23/48   (2006.01)
  H01L 23/52   (2006.01)
  H01L 29/40   (2006.01)
(52) U.S. Cl. .................. 257/738; 257/E23.023
(58) Field of Classification Search .......... 257/738, 257/E23.023

See application file for complete search history.

(56) References Cited

U.S. PATENT DOCUMENTS 6,995,469 B2 * 2/2006 Hatakeyama ............... 257/738

2007/0004083 A1 * 1/2007 Chiu et al. .................. 438/106

FOREIGN PATENT DOCUMENTS

JP   2001-144214   5/2001

OTHER PUBLICATIONS

R. Mathew, et al., "1 Gb/s Ethernet Physical Layer Device Package Development", 2006 Electronic Components and Technology Conference IEEE ECTC (p. 35-40) on May 31, 2006.

* cited by examiner

*Primary Examiner*—David S Blum
(74) *Attorney, Agent, or Firm*—McGinn IP Law Group, PLLC

(57) ABSTRACT

When a BGA package device is mounted to another substrate and tested for packaging strength, solder balls (8) frequently come detached in places where the edges of a semiconductor chip (1) align with the centers of the solder balls (8) on a BGA substrate (9) in the perpendicular direction of the substrate. In a semiconductor device of the present invention, the center of a semiconductor chip and the center of a BGA substrate to which the chip is mounted do not coincide with each other, and edges of the semiconductor chip do not align with the ball center positions on the BGA substrate in a direction perpendicular to the chip.

10 Claims, 6 Drawing Sheets

C1,C2

SEMICONDUCTOR DEVICE

BACKGROUND OF THE INVENTION

1. Field of the Invention

The present invention relates to a semiconductor device and, more particularly, to a semiconductor device with a ball grilled array (BGA) substrate in which a semiconductor chip is packaged.

2. Description of the Related Art

There has lately been an increasing demand for semiconductor devices used in mission-critical communication equipment and high-end computers to be faster and to have higher performance. To meet the demand, semiconductor chips and semiconductor devices in which semiconductor chips are packaged have to be reduced in size. One of miniaturization solutions is BGA packaging.

Techniques that revolve around bonding structures for bonding a BGA package and a circuit substrate are found in, for example, JP 2001-144214 A.

This publication discloses a semiconductor device and its bonding structure which prolong the bonding lifetime by giving metal balls that are on the perimeter a higher tensile strength than that of other metal balls.

Also, an article "1 Gb/s Ether Physical Layer Device Package Development" written by R. Mathew et al. and published in Proceedings of 2006 IEEE ECTC (p 35-40) on May 31, 2006 discloses a semiconductor device structure which accomplishes stable power supply by packaging a chip such that the chip center is decentered from the BGA substrate center.

However, conventional BGA packaging has never given consideration to the positional relation between the edges of a semiconductor chip and balls on a BGA substrate, in particular, the positional relation in a perpendicular direction with respect to the substrate in the process of mounting the semiconductor chip to the BGA substrate. This results in some devices having the edges of a semiconductor chip 1 at positions that align with the centers of solder balls 8 (landing pads 7 where a BGA substrate 9 and the solder balls 8 come into contact, to be exact) in the perpendicular direction of the substrate as shown in FIGS. 9 and 10.

A device assembled without giving consideration to the positional relation in the perpendicular direction between semiconductor chip edges and balls on a BGA substrate as described above has a problem in that, when mounted to another substrate (this is called secondary packaging) and then tested for packaging strength, the solder balls 8 frequently come detached in places where the edges of the semiconductor chip 1 align with the centers of the solder balls 8 on the BGA substrate 9 (the landing pads 7 where the BGA substrate 9 and the solder balls 8 come into contact, to be exact) in the perpendicular direction of the substrate.

SUMMARY OF THE INVENTION

A semiconductor device according to the present invention does not have semiconductor chip edges at positions that align with the centers of landing pads (=the centers of solder balls) bonded to a BGA substrate.

Preferably, the center of a semiconductor chip and the center of a BGA substrate to which the chip is mounted do not coincide with each other, and at least one of the edges of the semiconductor chip does not align with landing pads on the BGA substrate (=places where the BGA substrate and solder balls are connected to each other).

Thus, at least one of semiconductor chip edges does not align with the ball center position on an assembled substrate (preferably, landing pads where solder balls come into contact with the assembled substrate), stress concentrations on the landing pads are therefore avoided after assembly.

As has been described, the present invention makes it possible to reduce the defect of a ball and a BGA substrate falling apart from each other during or after assembly. A possible mechanism of this defect is as follows:

An edge of a semiconductor chip is the interface between the semiconductor chip and packaging resin. Distortion from stress generated on the interface, especially stress due to heat, concentrates on the interface. Furthermore, the concentrated stress increases the stress difference among a BGA substrate, a solder ball, and a secondary packaging substrate which are under the interface, until the concentrated stress ultimately separates the solder ball from a landing pad. Placing the interface off an imaginary line extended from the landing pad therefore reduces the above defect exponentially.

The above placement also mitigates limitation on chip size for semiconductor devices. Specifically, although the solder ball position in the semiconductor device to be mounted to the secondary packaging substrate is fixed with respect to the wiring pattern on the secondary packaging substrate, and this may put an edge of the semiconductor chip at the above-described solder ball position, no problems arise if the semiconductor chip is mounted to the packaging substrate such that the semiconductor chip center is offset from the center of the packaging substrate (will be called eccentric mounting).

Eccentric mounting, which provides an increased degree of freedom in chip size, also makes it easy to deal with simple chip shrinking or minor changes to the chip while maintaining the fixed solder ball position.

In memories and other products with high cell occupation ratio, eccentric mounting is effective in dealing with the proximity between a chip edge and the center of a solder ball (landing pad) which accompanies an increase/decrease in degree of integration (such as a simple cutdown or double-up, and a chip size reduction through simple process shrinking). This is because, in memories and the like where the cell occupation ratio is high and accordingly a change in memory capacity or a change in cell size leads directly to an increase or decrease in chip size, in other words, a change in degree of integration is likely to change the positional relation between a chip edge and a landing pad from the initial, non-problematic one to a problematic one, eccentric mounting makes it possible to set the positional relation between the chip edge and the landing pad arbitrarily without needing a major design change.

Another advantage is that the packaging area can be reduced in the secondary packaging substrate. Specifically, the secondary packaging area is reduced by putting all of solder balls which are arranged at the minimum pitch on the matrix into use. In other words, it eliminates the need for consideration and limitation in ball arrangement that ensures the reliability of solder balls, for example, omitting balls from an area directly below the semiconductor chip, especially areas immediately below chip edges and immediately below chip corners, or making solder balls in those areas as non-functional, dummy balls.

BRIEF DESCRIPTION OF THE DRAWINGS

The above and other objects, characteristics, and effects of the present invention will be understood more clearly by reading the following detailed description on embodiments of the present invention when taken in conjunction with the accompanying drawings in which.

DETAILED DESCRIPTION OF THE PREFERRED EMBODIMENTS

Figure 1:
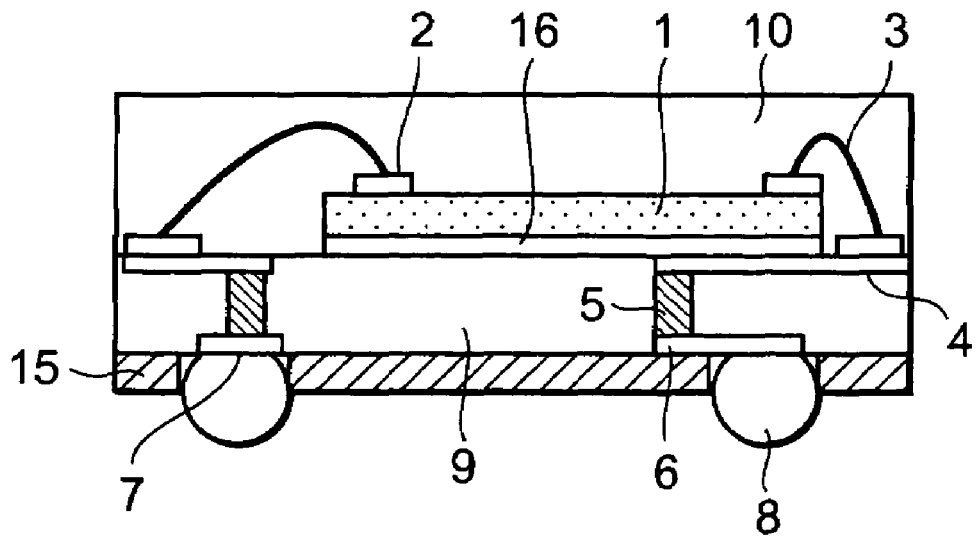
FIG. 1 is a diagram showing a cross-sectional view of a semiconductor device according to a first embodiment of the present invention.
Figure 2:
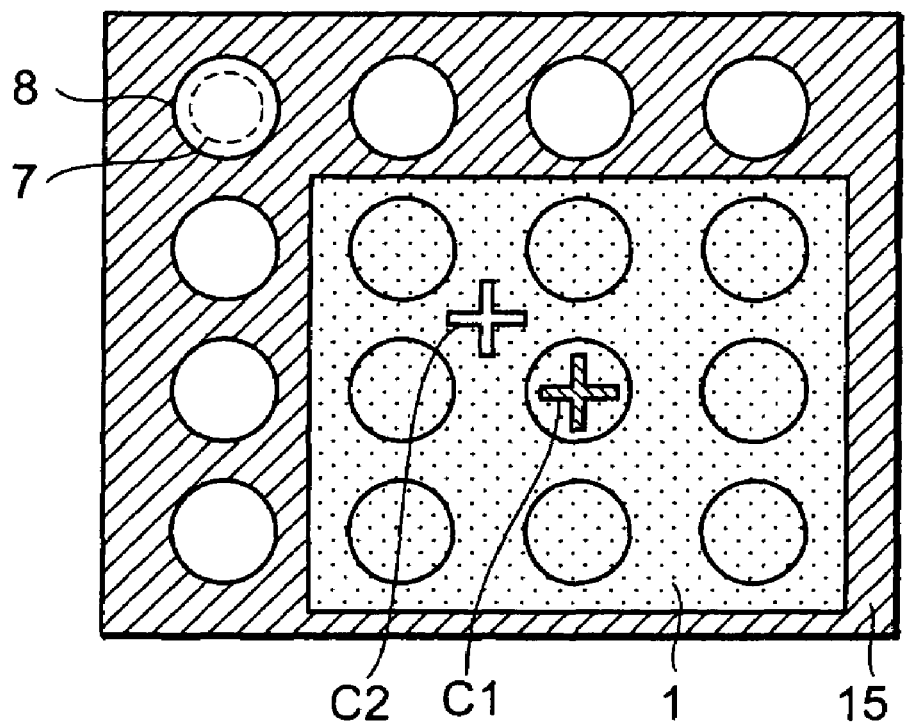
FIG. 2 is a diagram showing a plan view of the semiconductor device according to the first embodiment of the present invention.
Figure 3:
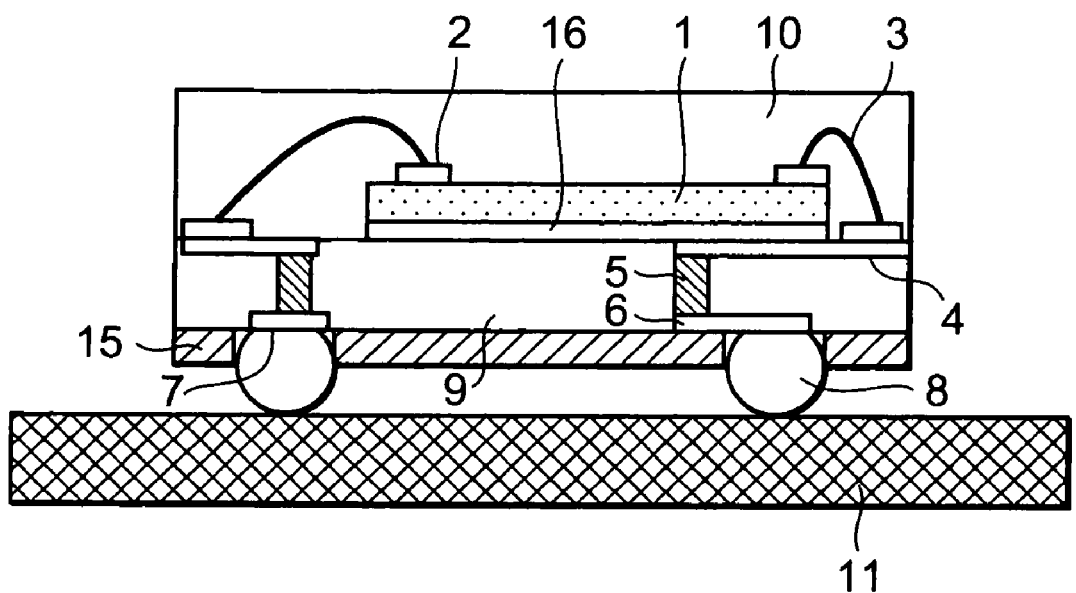
FIG. 3 is a diagram in which the semiconductor device according to the first embodiment of the present invention is mounted.

FIGS. 1 through 3 are diagrams showing a semiconductor device according to a first embodiment of the present invention. FIG. 1 is a diagram showing a cross-sectional view of the semiconductor device according to the first embodiment of the present invention, and FIG. 2 is a planar perspective view of the semiconductor device viewed from the above. FIG. 3 is a cross-sectional view in which the semiconductor device is mounted to another substrate (this is called secondary packaging).

In FIG. 1, wiring (circuit) patterns 4 and 6 are formed on the top and bottom faces of a BGA substrate 9, and a semiconductor chip 1 is mounted to the top or bottom-face of the BGA substrate 9 with an adhesive 16 (this is called primary packaging). Bonding pads 2 on the semiconductor chip 1 are electrically coupled by bonding wires 3 to the wiring patterns 4 on the top face of the BGA substrate 9. The wiring patterns 4 are coupled to wiring patterns 6, which are on the bottom face of the circuit substrate 9, through through holes 5, and also coupled to solder balls 8 through landing pads 7. A piece of insulating tape 15 covers an area between the landing pads 7 on the other face of the BGA substrate 9 to which the chip is not mounted. The semiconductor chip 1 on the BGA substrate 9 is covered with mold resin 10.

Referring now to the planar perspective view of FIG. 2, the drawing looks up to the semiconductor chip from below. The position of the semiconductor chip 1 which otherwise cannot be seen from below is seen through in FIG. 2. As illustrated in the drawing, the semiconductor chip 1 is mounted to the circuit substrate 9 such that central coordinates C1 of the semiconductor chip 1 do not coincide with central coordinates C2 of the circuit substrate 9. This prevents edges of the semiconductor chip 1 from aligning with the centers of the solder balls 8 (the landing pads 7 where the solder balls and the BGA substrate are bonded). FIG. 2 employs a solid line to indicate the solder ball diameter and a dotted line to indicate the landing pad diameter. The insulating tape 15 covers the bottom face of the BGA substrate except the landing pads.

When the above semiconductor device is mounted to another substrate for secondary packaging, the substrate positioning of conventional art in which the edges of the semiconductor chip 1 align with the centers of the solder balls 8 on the BGA substrate 9 in a direction perpendicular to the substrate is avoided as shown in FIG. 3. The stress concentration generated on contact areas between the balls and the BGA substrate is thus mitigated, and the defect of the solder balls 8 coming detached from the landing pads 7 during or after assembly is reduced drastically.

Figure 4:
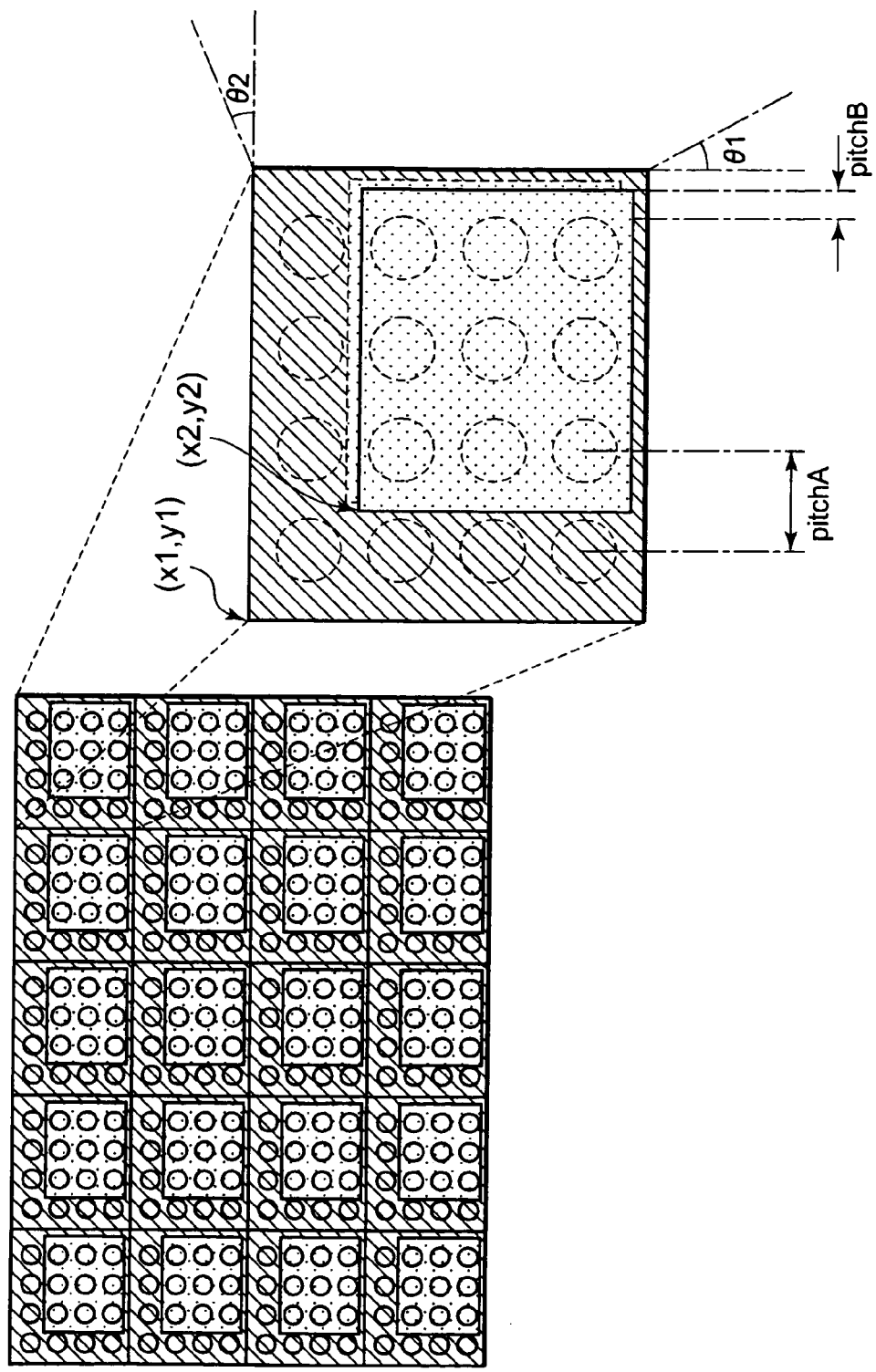
FIG. 4 is a schematic diagram of common semiconductor device packaging.

Now, a brief description will be given with reference to FIG. 4 on positioning of the semiconductor chip 1 and the BGA substrate 9 in relation to each other. The four sides of the semiconductor chip are positioned (angles θ1 and θ2 in FIG. 4) in relation to the four sides of the BGA substrate which has given numbers of rows and columns (three rows×five columns in the drawing). One chip taken out of the fifteen chips will be discussed in the following description for simplification.

After the four sides (=angles) are positioned, the semiconductor chip can be disposed in any place of the BGA substrate by simply setting corner coordinates of the semiconductor chip 1 (x2, y2) with respect to corner coordinates of the BGA substrate (x1, y1) in a mounting machine. The center of the semiconductor chip and the center of the BGA substrate are thus prevented from coinciding with each other.

The solder ball interval (pitch A) shown in the drawing is normally 1.0 mm, and 0.5 mm in the case of fine pitch BGA (FPBGA), whereas the arrangement accuracy or error of the mounting machine (pitch B) is about±a few tens to a few hundreds μm. An edge of the semiconductor chip can therefore be placed in a gap between solder balls with ease. Thus, it is easy to position edges of a semiconductor chip between solder balls of the BGA substrate while setting the center of the semiconductor chip off from the center of the BGA substrate.

Figure 5:
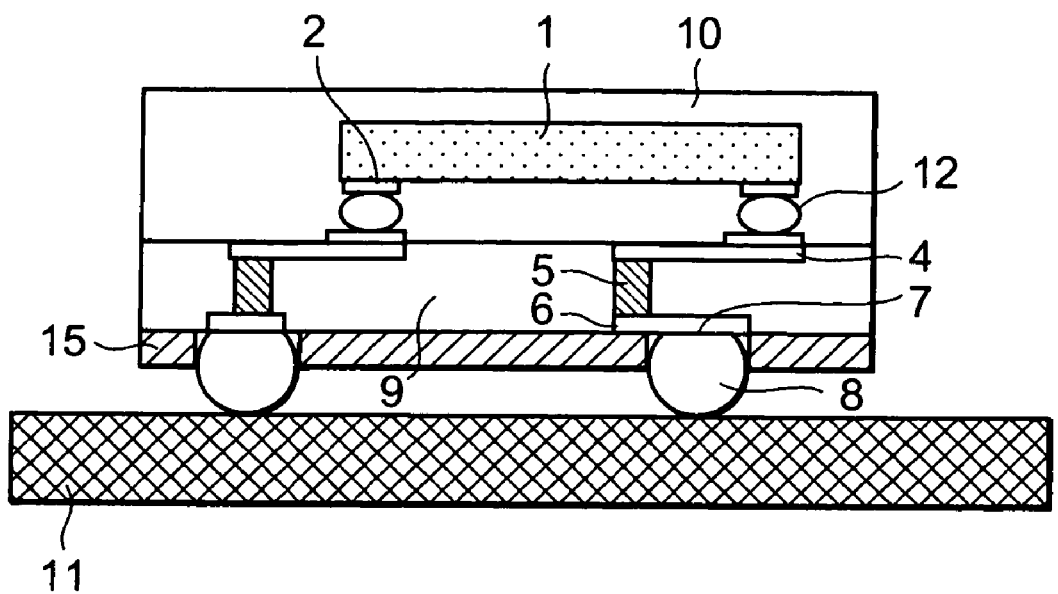
FIG. 5 is a diagram showing a modification example of the semiconductor device according to the first embodiment of the present invention.

The above embodiment takes assembly by bonding as an example. A modification example of the first embodiment of the present invention is shown in FIG. 5. In the modification example, the semiconductor chip 1 is a flip chip and pads 2 on the flip chip are press-fit to the BGA substrate 9 through metal bumps 12. The semiconductor chip 1 in this case, too, is positioned such that semiconductor chip edges do not align with the solder ball centers as in the above embodiment.

Figure 6:
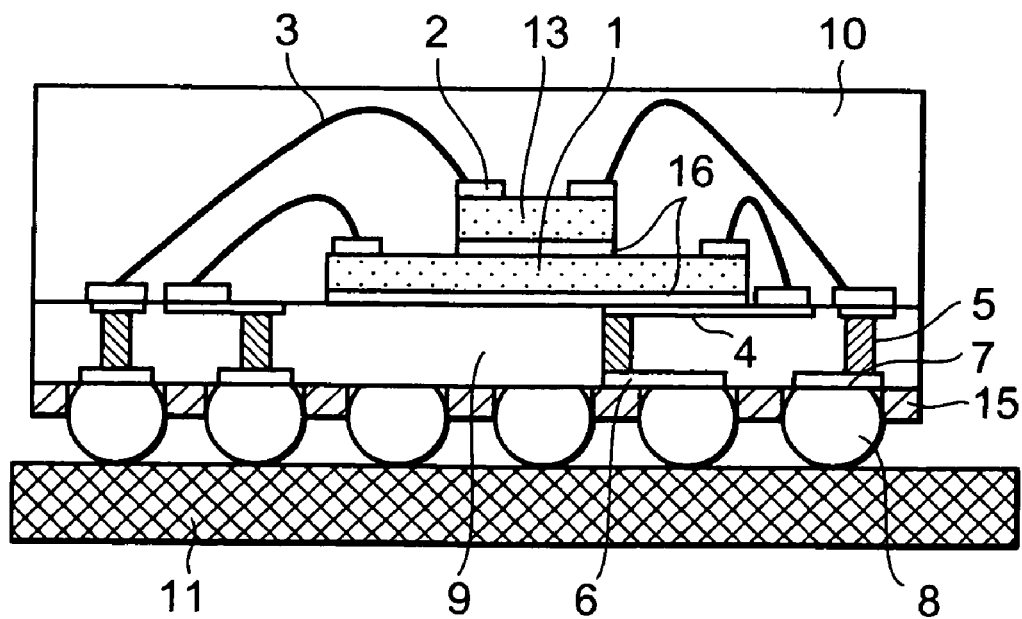
FIG. 6 is a diagram showing a cross-sectional view of a semiconductor device according to a second embodiment of the present invention.
Figure 7:
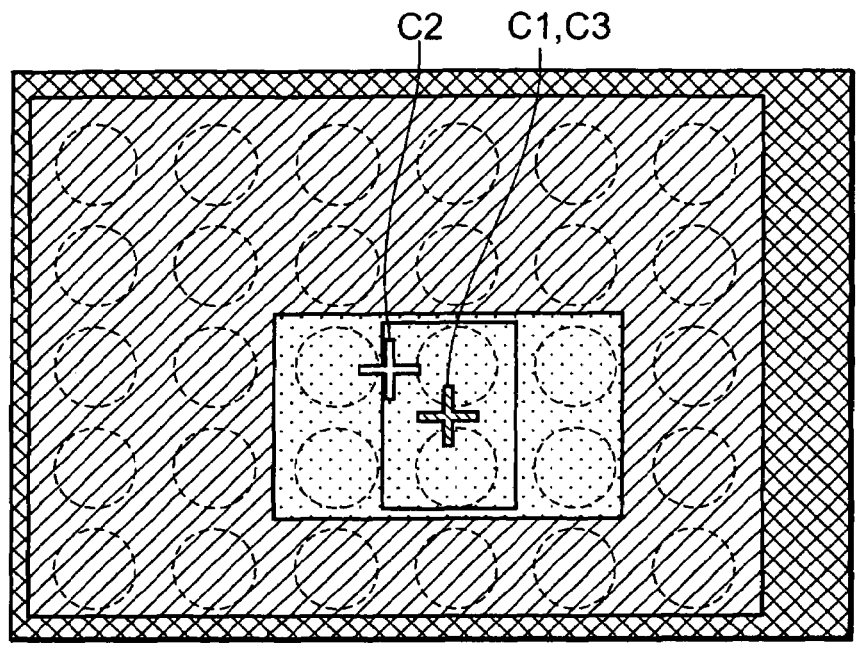
FIG. 7 is a diagram showing a plan view of the semiconductor device according to the second embodiment of the present invention.

FIGS. 6 and 7 are diagrams showing a semiconductor device according to a second embodiment of the present invention.

In FIG. 6, a semiconductor chip 13 is layered over the semiconductor chip 1 of the first embodiment of the present invention, thereby making a multi-chip package (MCP) structure. The two layered semiconductor chips are arranged such that their respective edges do not align with the ball positions on the BGA substrate in the perpendicular direction as in the first embodiment of the present invention. This will be described below with reference to FIG. 7, which is a diagram visualizing a planar perspective view of the chip from above the chip.

The center of the lower semiconductor chip 1 and the center of the upper semiconductor chip 13 coincide with each other in this embodiment. Depending on the chip size of the upper chip, or the chip aspect ratio, however, the centers of the upper and lower semiconductor chips must not coincide with each other.

Figure 8:
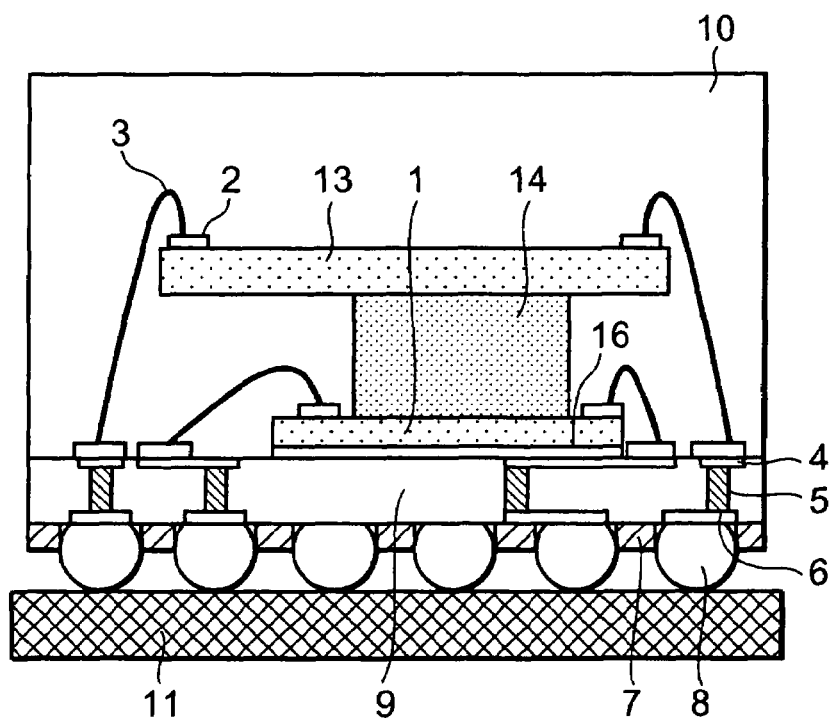
FIG. 8 is a diagram showing a modification example of the semiconductor device according to the second embodiment of the present invention.
Figure 9:
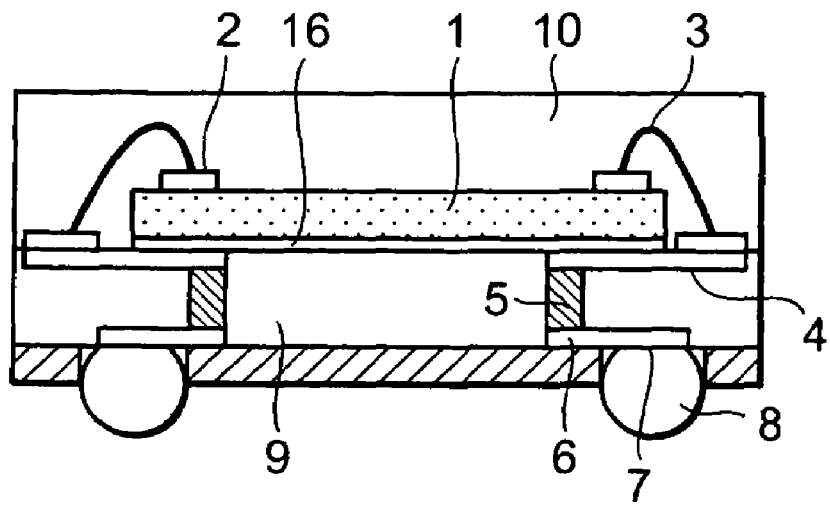
FIG. 9 is a diagram showing a cross-sectional view of a conventional semiconductor device.
Figure 10:
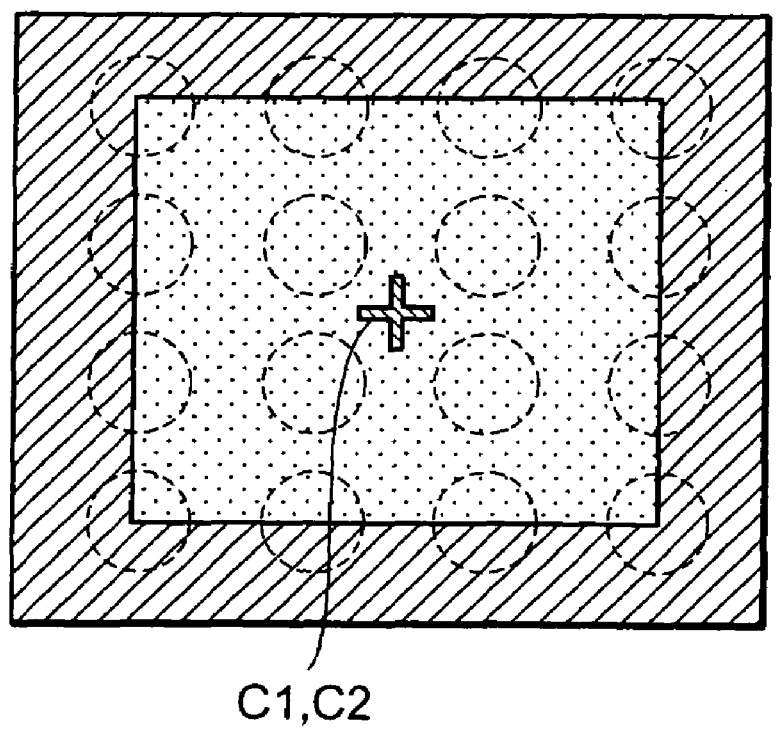
FIG. 10 is a diagram showing a plan view of the conventional semiconductor device.

FIG. 8 is a modification example of the second embodiment of the present invention. Shown in FIG. 8 is a case in which the upper chip size is larger than the lower chip size, or opposing two sides are longer in the upper chip than in the lower chip, in other words, the upper chip protrudes from the lower chip.

Such cases only need to secure a bonder clearance in a direction perpendicular to the chips so that the lower semiconductor chip can be bonded, in other words, to simply secure a space for the trajectory of a bonder's arm during bonding. The modification example therefore employs a spacer 14, which keeps the upper and lower chips apart from each other.

The first semiconductor chip 1 is mounted to the BGA substrate, the spacer 14 is placed on the first semiconductor chip 1, and then the second semiconductor chip 13 is mounted to the spacer 14.

Also in this case, positioning the upper and lower semiconductor chips such that their respective four edges do not align with the BGA ball centers makes the obtained effect more prominent.

The present invention is not limited to the embodiments described above, and it is obvious that the embodiments can be modified at one's discretion within the scope of the technical concept of the present invention. For instance, the first and second embodiments of the present invention may be employed in combination, so that the lower chip is flip chip-bonded and the second chip is mounted to the lower chip by bonding.

The number of chip layers is not limited to two, and three or more semiconductor chips may be layered and, needless to say, the present invention is applicable not only to cases where multiple chips are stacked but also to cases where multiple chips are arranged side by side. And the present invention is applicable not only to case where BGA but also to cases where LGA etc. In other words, the ball can be changed to a terminal.

What is claimed is:

1. A semiconductor device, comprising:
   a semiconductor chip having edges thereof;
   an assembly substrate to which the semiconductor chip is mounted;
   a plurality of land pads provided on the assembled substrate to connect the balls to the assembled substrate, and
   a plurality of terminals provided above said land pads;
   wherein a center of the semiconductor chip is offset from a center of the assembly substrate, said edges being offset from the land pads.

2. A semiconductor device according to claim 1, wherein said edges have lengths thereof such that said edges overlap with said land pads when the center of the semiconductor chip and the center of the assembly substrate coincide with each other.

3. A semiconductor device according to claim 1, wherein the semiconductor chip is coupled to the assembly substrate by bonding.

4. A semiconductor device according to claim 1, wherein the semiconductor chip is coupled to the assembly substrate by flip chip bonding.

5. A semiconductor device according to claim 1, wherein the terminals are arranged on the assembly substrate at equal intervals in matrix.

6. A semiconductor device according to claim 5, wherein the terminal is a ball.

7. A semiconductor device according to claim 1, further comprising a second semiconductor chip having second edges, which is different from the semiconductor chip,
   wherein the second edges of the second semiconductor chip have lengths thereof such that said second edges overlap with said land pads when the center of the second semiconductor chip and the center of the assembly substrate coincide with each other.

8. A semiconductor device according to claim 7, further comprising a spacer between the semiconductor chip and the second semiconductor chip.

9. A semiconductor device, comprising:
   a semiconductor chip having an edge thereof;
   an assembled substrate to which the semiconductor chip is mounted;
   land pads provided on the assembled substrate to connect the balls to the assembly substrate, and
   terminals for mounting the assembly substrate;
   wherein a center of the semiconductor chip is offset from a center of the assembly substrate, said edge being offset from the land pads.

10. A semiconductor device according to claim 9, wherein said edge has length thereof such that said edge overlap with one of said land pads when the center of the semiconductor chip and the center of the assembly substrate coincide with each other.

* * * * *